US012693655B2

(12) United States Patent
Yamazaki et al.

(10) Patent No.: US 12,693,655 B2
(45) Date of Patent: Jul. 28, 2026

(54) MAINTENANCE DEVICE

(71) Applicant: FUJI CORPORATION, Chiryu (JP)

(72) Inventors: Yusuke Yamazaki, Chiryu (JP); Yuji Kawasaki, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 385 days.

(21) Appl. No.: 18/547,519

(22) PCT Filed: Mar. 9, 2021

(86) PCT No.: PCT/JP2021/009247
§ 371 (c)(1),
(2) Date: Aug. 23, 2023

(87) PCT Pub. No.: WO2022/190201
PCT Pub. Date: Sep. 15, 2022

(65) Prior Publication Data
US 2024/0134352 A1    Apr. 25, 2024
US 2024/0231323 A9    Jul. 11, 2024

(51) Int. Cl.
*G05B 19/4155*    (2006.01)
*H05K 13/02*    (2006.01)
*H05K 13/08*    (2006.01)

(52) U.S. Cl.
CPC ......... *G05B 19/4155* (2013.01); *H05K 13/02* (2013.01); *H05K 13/081* (2018.08); *G05B 2219/39241* (2013.01)

(58) Field of Classification Search
None
See application file for complete search history.

(56) References Cited

U.S. PATENT DOCUMENTS 5,099,522 A * 3/1992 Morimoto ................. G06T 7/70
                                                            348/126
2016/0330880 A1* 11/2016 Morikawa ............ B65G 47/145
(Continued)

FOREIGN PATENT DOCUMENTS

EP        3468330 A1 *  4/2019    ......... H05K 13/0813
JP        4681158 B2 *  5/2011
JP        2011-114084 A   6/2011

OTHER PUBLICATIONS

International Search Report issued May 25, 2021 in PCT/JP2021/009247, filed on Mar. 9, 2021, 2 pages.

*Primary Examiner* — David Earl Ogg
(74) *Attorney, Agent, or Firm* — Oblon, McClelland, Maier & Neustadt, L.L.P.

(57) ABSTRACT

A maintenance device is applied to a bulk feeder including a feeder main body section, a track member, a vibration device, and a cavity group, and includes an initialization section and a vibration force control section. When the use time of the bulk feeder elapses a predetermined time, the initialization section returns a supply component existing in the cavity group toward a receiving region, and sets the cavity group to an initialization state in which the supply component does not exist in the cavity group. The vibration force control section increases the vibration force to be applied by the vibration device to the track member in the initialization section as compared with a case where the supply component is returned from the supply region toward the receiving region in order to adjust the number of the supply components conveyed to the cavity group when a board product is produced.

11 Claims, 7 Drawing Sheets

(56)  References Cited

U.S. PATENT DOCUMENTS

| | | | |
|---|---|---|---|
| 2018/0180669 A1* | 6/2018 | Kotani | G01R 31/2893 |
| 2019/0276173 A1* | 9/2019 | Takeuchi | H01L 21/67333 |
| 2020/0015394 A1* | 1/2020 | Ishikawa | H05K 13/08 |

* cited by examiner

Fig. 11

MAINTENANCE DEVICE

TECHNICAL FIELD

The present description discloses a technique relating to a maintenance device.

BACKGROUND ART

A bulk feeder supplies a supply component discharged from a component case that accommodates multiple components in a bulk state to a component mounter. As described in Patent Literature 1, a bulk feeder for supplying scattered supply components in a supply region in which a holding member of a mounting head can collect the supply components is known. In addition, a bulk feeder including a cavity group including multiple cavities into which one component of the supply components conveyed to the supply region is to be accommodated is known.

PATENT LITERATURE

Patent Literature 1: JP-A-2011-114084

BRIEF SUMMARY

Technical Problem

In a bulk feeder including a cavity group, a foreign matter tends to remain in a cavity. In addition, a stacked state in which a supply component is fitted in a cavity may occur. As these situations occur, the number of cavities capable of supplying supply components may decrease, resulting in a deterioration in the production efficiency of a board product. Therefore, there is a demand for periodic maintenance of the cavity group. In addition, there is a demand for determining whether there is a member (a removal target object to be removed) included in the cavity group.

In view of such circumstances, the present description discloses a maintenance device capable of periodically maintaining a cavity group of a bulk feeder, and a maintenance device capable of determining whether there is a removal target object in the cavity group.

Solution to Problem

The present description discloses a first maintenance device applied to a bulk feeder including a feeder main body section, a track member, a vibration device, and a cavity group, the first maintenance device including an initialization section and a vibration force control section. The track member includes a receiving region that is provided in the feeder main body section and receives a supply component which is a part of multiple components discharged from a component case in which the multiple components are accommodated in a bulk state and supplied to a component mounter, a supply region where the component mounter can collect the supply component, and a conveyance path on which the supply component is conveyed between the receiving region and the supply region. The vibration device is provided in the feeder main body section and vibrates the track member to convey the supply component on the conveyance path between the receiving region and the supply region. The cavity group is provided in the supply region and includes multiple cavities in which one component of the supply components conveyed from the receiving region to the supply region is to be accommodated. Every time the use time of the bulk feeder elapses a predetermined time, the initialization section returns a supply component existing in the cavity group toward a receiving region, and sets the cavity group to an initialization state in which the supply component does not exist in the cavity group as much as possible. The vibration force control section increases the vibration force to be applied to the track member by the vibration device in the initialization section as compared with a case where the supply component is returned from the supply region toward the receiving region in order to adjust the number of the supply components conveyed to the cavity group when a board product is produced.

In addition, the present description discloses a second maintenance device applied to a bulk feeder including a feeder main body section, a track member, a vibration device, and a cavity group, the second maintenance device including an imaging section and a determination section. The track member includes a receiving region that is provided in the feeder main body section and receives a supply component which is a part of multiple components discharged from a component case in which the multiple components are accommodated in a bulk state and supplied to a component mounter, a supply region where the component mounter can collect the supply component, and a conveyance path on which the supply component is conveyed between the receiving region and the supply region. The vibration device is provided in the feeder main body section and vibrates the track member to convey the supply component on the conveyance path between the receiving region and the supply region. The cavity group is provided in the supply region and includes multiple cavities in which one component of the supply components conveyed from the receiving region to the supply region is to be accommodated. The imaging section causes an imaging device to image the cavity group in an initialization state in which the supply component does not exist in the cavity group as much as possible. The determination section performs image processing on image data of the cavity group acquired by the imaging section to determine whether there is a removal target object that is at least one of a foreign matter remaining in the cavity group and the supply component fitted in the cavity of the cavity group.

Advantageous Effects

According to the first maintenance device described above, it is possible to periodically maintain a cavity group. In addition, according to the second maintenance device described above, it is possible to determine whether there is a removal target object in the cavity group.

BRIEF DESCRIPTION OF DRAWINGS

FIG. 11 is a flowchart illustrating an example of a control procedure by the second maintenance device.

DESCRIPTION OF EMBODIMENTS

1. Embodiment

1-1. Example of Configuration of Component Mounter 10

Figure 1:
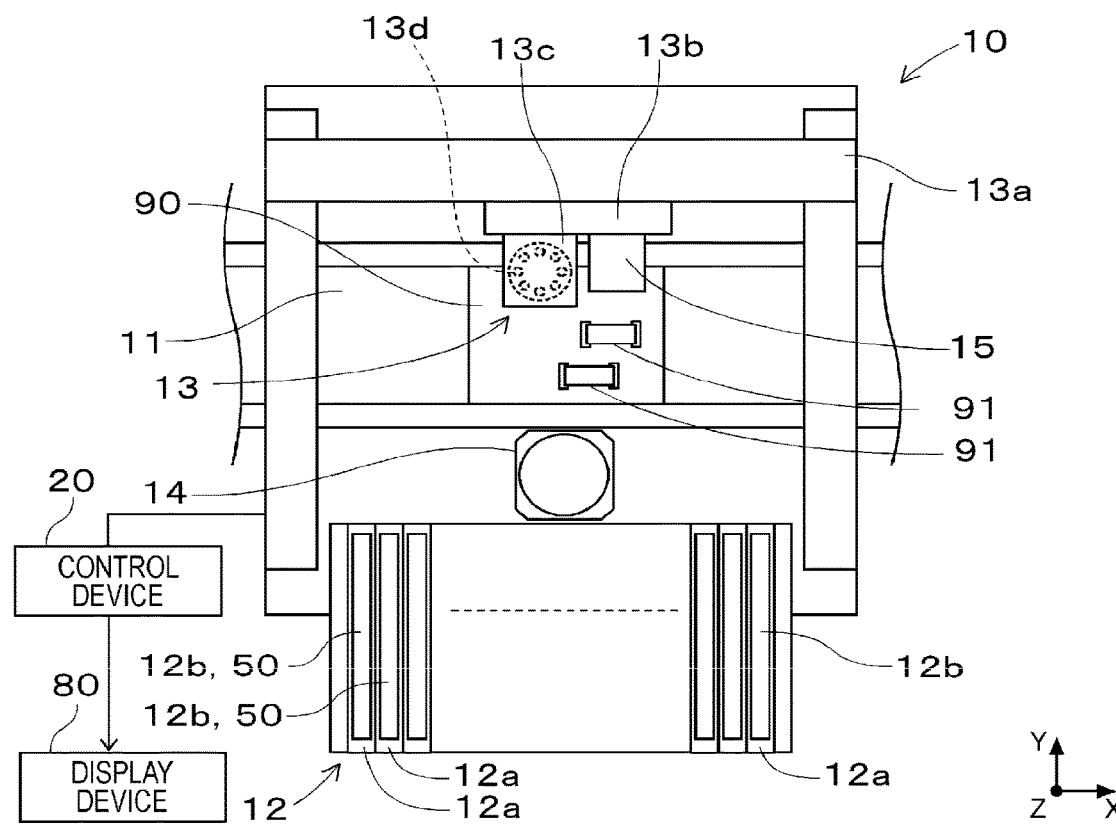
FIG. 1 is a plan view illustrating an example of a configuration of a component mounter.

Component mounter 10 mounts multiple components 91 on board 90. As illustrated in FIG. 1, component mounter 10 includes board conveyance device 11, component supply device 12, component transfer device 13, part camera 14, board camera 15, and control device 20.

For example, board conveyance device 11 includes a belt conveyor or the like, and conveys board 90 in a conveyance direction (X-axis direction). Board 90 is a circuit board, on which an electronic circuit, an electrical circuit, a magnetic circuit, and the like are formed. Board conveyance device 11 conveys board 90 into component mounter 10 and positions board 90 at a predetermined position in component mounter 10. After a process of mounting multiple components 91 by component mounter 10 is ended, board conveyance device 11 conveys board 90 out of component mounter 10.

Component supply device 12 supplies multiple components 91 to be mounted on board 90. Component supply device 12 includes multiple feeders 12b provided along a conveyance direction (X-axis direction) of board 90. Each of multiple feeders 12b is detachably attached to slot 12a. As feeder 12b of the present embodiment, at least bulk feeder 50 among a tape feeder and bulk feeder 50 is used. The tape feeder pitch-feeds a carrier tape in which multiple components 91 are accommodated to collectably supply components 91 at a supply position. Bulk feeder 50 collectably supplies supply component 91s (a part of multiple components 91 accommodated in component case 52) discharged from component case 52 that accommodates multiple components 91 in a bulk state (the posture of multiple components 91 is irregular).

Component transfer device 13 includes head driving device 13a, moving table 13b, mounting head 13c, and holding member 13d. Head driving device 13a is configured to move moving table 13b in the X-axis direction and the Y-axis direction by a linear motion mechanism. Mounting head 13c is detachably (replaceable) provided on moving table 13b by a clamp member. Mounting head 13c collects and holds components 91 supplied by component supply device 12 with at least one holding member 13d, and mount components 91 on board 90 positioned by board conveyance device 11. As holding member 13d, for example, a suction nozzle, a chuck, or the like can be used.

As part camera 14 and board camera 15, a well-known imaging device can be used. Part camera 14 is fixed to a base of component mounter 10 such that an optical axis faces upward in a vertical direction (Z-axis direction). Part camera 14 can image component 91 held by holding member 13d from below. Board camera 15 is provided on moving table 13b of component transfer device 13 such that an optical axis is oriented downwards in the vertical direction (the Z-axis direction). Board camera 15 can image board 90 from above. Part camera 14 and board camera 15 perform imaging based on a control signal transmitted from control device 20. The image data of an image captured by part camera 14 and board camera 15 are transmitted to control device 20.

Control device 20 includes a well-known computing device and a storage device, and constitutes a control circuit. Information, image data, and the like output from various sensors provided in component mounter 10 are input to control device 20. Control device 20 transmits a control signal to each device based on a control program, a predetermined mounting condition set in advance, and the like.

For example, control device 20 causes board camera 15 to image board 90 positioned by board conveyance device 11. Control device 20 performs image processing on the image captured by board camera 15 to recognize the positioning state of board 90. In addition, control device 20 causes holding member 13d to collect and hold components 91 supplied by component supply device 12, and causes part camera 14 to image component 91 held by holding member 13d. Control device 20 performs image processing on the image captured by part camera 14 to recognize the holding posture of component 91.

Control device 20 moves holding member 13d toward above a predetermined planned mounting position set in advance by a control program or the like. In addition, control device 20 corrects the planned mounting position based on the positioning state of board 90, the holding posture of component 91, and the like, and sets the mounting position at which component 91 is actually mounted. The planned mounting position and the mounting position include a rotation angle in addition to the position (X-axis coordinate and Y-axis coordinate).

Control device 20 corrects the target position (X-axis coordinate and Y-axis coordinate) and the rotation angle of the holding member 13d in accordance with the mounting position. Control device 20 lowers holding member 13d at the corrected rotation angle at the corrected target position, and mounts component 91 on board 90. Control device 20 executes mounting processing for mounting multiple components 91 on board 90 by repeating the pick-and-place cycle described above.

1-2. Example of Configuration of Bulk Feeder 50

Figure 2:
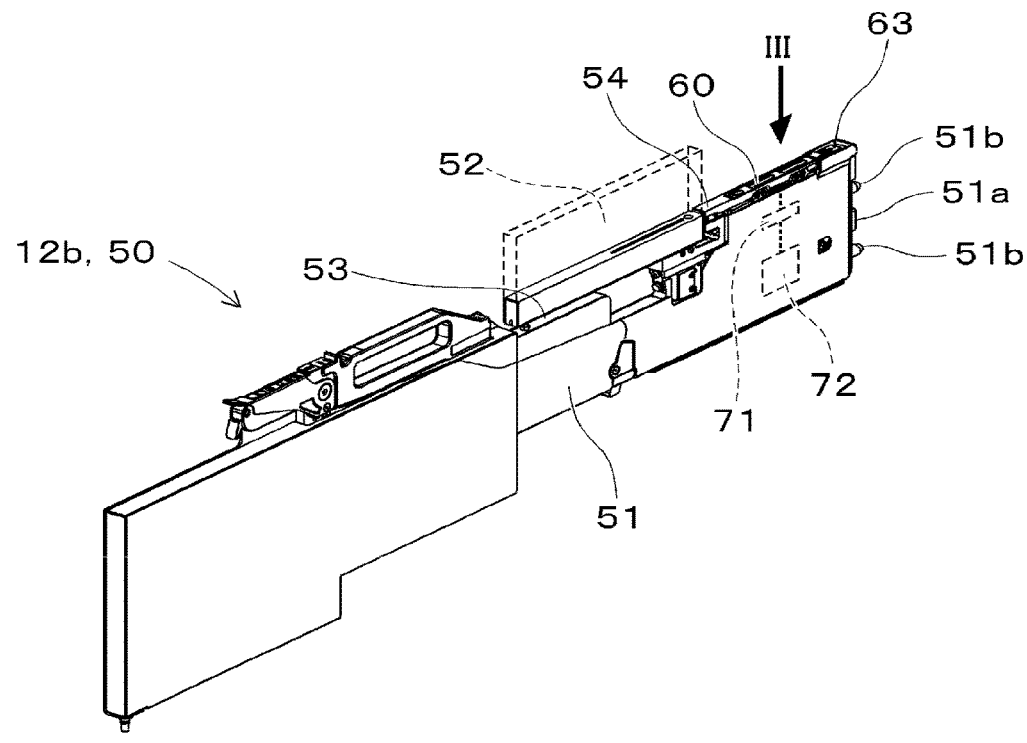
FIG. 2 is a perspective view illustrating an example of a bulk feeder.

As illustrated in FIG. 2, bulk feeder 50 of the present embodiment includes feeder main body section 51, component case 52, discharge device 53, cover 54, track member 60, vibration device 71, and feeder control device 72. Feeder main body section 51 is formed in a flat box shape. Feeder main body section 51 is detachably installed in slot 12a of component supply device 12.

Connector 51a and multiple (two in FIG. 2) pins 51b and 51b are formed at a front portion of feeder main body section 51. Connector 51a is provided to communicate with control device 20 when bulk feeder 50 is installed in slot 12a. Bulk feeder 50 is supplied with power via connector 51a. Multiple (two) pins 51b and 51b are used for positioning when feeder main body section 51 is installed in slot 12a.

Component case 52 for accommodating multiple components 91 in a bulk state is detachably attached to feeder main body section 51. Component case 52 is configured to discharge component 91 to the outside. Component case 52 of the present embodiment is an external device of bulk feeder 50. For example, a worker selects one component case 52 suitable for the mounting processing from among multiple component cases 52, and attaches selected component case 52 to feeder main body section 51.

Discharge device 53 adjusts the number of components 91 to be discharged from component case 52. Discharge device 53 discharges supply component 91s to receiving region Ar0 of track member 60 illustrated in FIG. 3. Supply component 91s refers to a portion of multiple components 91 that are discharged from component case 52 and supplied to component mounter 10. Cover 54 is detachably attached to the front upper portion of feeder main body section 51. Cover 54 suppresses the scattering of supply component 91s for being conveyed on conveyance path Rd0 of track member 60 illustrated in FIG. 3 to the outside.

Figure 3:
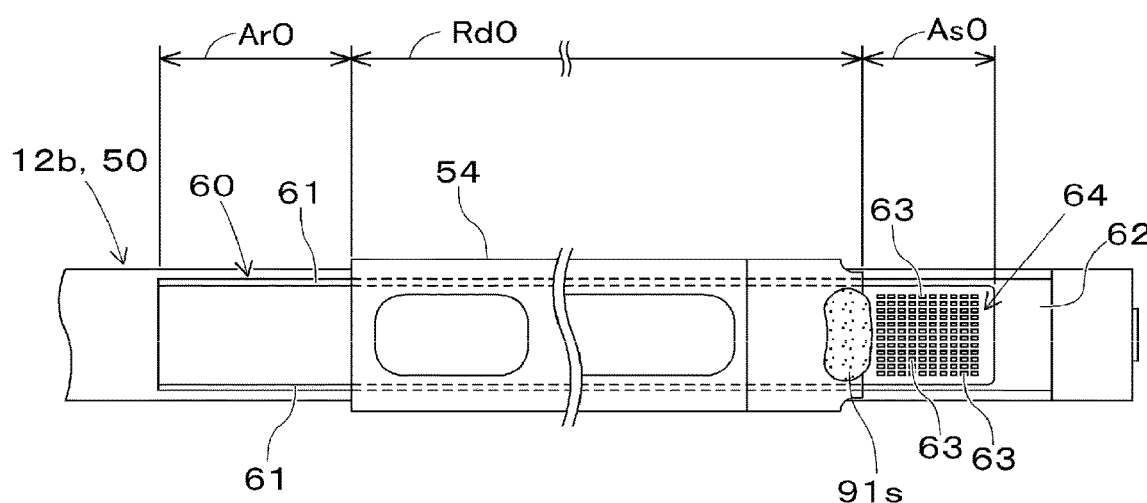
FIG. 3 is a plan view as viewed in the direction of the arrow III in FIG. 2.

Track member 60 is provided in the front upper portion of feeder main body section 51. As illustrated in FIG. 3, track member 60 is formed to extend in the front-rear direction of feeder main body section 51 (the left-right direction of the drawing sheet in FIG. 3). A pair of side walls 61 and 61 protruding upward are formed on both edges of track member 60 in the width direction (the up-down direction of the drawing sheet in FIG. 3). The pair of side walls 61 and 61 surround the periphery of conveyance path Rd0 together with tip portion 62 of track member 60, thereby suppressing the leakage of supply component 91s that is conveyed on conveyance path Rd0.

As illustrated in FIG. 3, track member 60 includes receiving region Ar0, supply region As0, and conveyance path Rd0. Receiving region Ar0 is a region for receiving supply components 91s in a bulk state. Receiving region Ar0 of the present embodiment is provided below the discharge port of component case 52. Supply region As0 is a region in which component mounter 10 can collect supply component 91s. Specifically, supply region As0 is a region in which supply component 91s can be collected by holding member 13d supported by mounting head 13c, and is included in the movable range of mounting head 13c.

Conveyance path Rd0 is provided between receiving region Ar0 and supply region As0 so that supply component 91s is conveyed between receiving region Ar0 and supply region As0. Conveyance path Rd0 of the present embodiment is formed in a groove shape having a horizontal bottom surface. The side face of conveyance path Rd0 is formed by the pair of side walls 61 and 61. The opening section above conveyance path Rd0 is generally closed by cover 54. Track member 60 is supported to be slightly displaceable (that is, vibratable) with respect to feeder main body section 51 in a virtual perpendicular plane formed by the front-rear direction and the up-down direction.

Cavity group 64 is provided in supply region As0. Cavity group 64 includes multiple cavities 63 (120 in the present embodiment) into which one component 91 of supply component 91s conveyed from receiving region Ar0 to supply region As0 is to be accommodated. That is, each of multiple (120) cavities 63 is planned to accommodate one component 91. Specifically, multiple (120) cavities 63 are arranged in a matrix in supply region As0. For example, cavity group 64 includes a total of 120 cavities 63 arranged by 10 in the conveyance direction and 12 in the width direction of conveyance path Rd0, respectively.

Each of multiple (120) cavities 63 opens upwardly on conveyance path Rd0 to accommodate component 91 in a posture in which the thickness direction of component 91 is in the up-down direction. The opening section of cavity 63 is set to a dimension slightly larger than the outer shape of component 91 in the upper view. The depth of cavity 63 is appropriately set according to the type (shape, mass, and the like) of component 91. The shape of cavity 63 is similar to the shape of the accommodation section formed on the carrier tape when it is assumed that component 91 is housed in the carrier tape and supplied by the tape feeder. In addition, the number of cavities 63 is appropriately set in consideration of the shape, the required number, and the density that may affect the ability of conveyance of cavities 63.

In addition, the number of cavities 63 may be set to be larger than the maximum number of components 91 collected by the collection operation in one pick-and-place cycle. The maximum number corresponds to the number of holding members 13d supported by mounting head 13c. For example, in a case where mounting head 13c supports 24 suction nozzles, the number of cavities 63 may be set to be at least more than 24.

Vibration device 71 is provided in feeder main body section 51. Vibration device 71 vibrates track member 60 to convey supply component 91s on conveyance path Rd0 between receiving region Ar0 and supply region As0. Specifically, vibration device 71 causes track member 60 to perform an elliptical motion in a clockwise direction or a counterclockwise direction in a horizontal direction orthogonal to the conveyance direction of supply component 91s on conveyance path Rd0. At this time, vibration device 71 vibrates track member 60 so that an external force directed toward the front or rear and upward is applied to supply component 91s on conveyance path Rd0.

Vibration device 71 includes, for example, a support member that connects feeder main body section 51 and track member 60, a piezoelectric element attached to the support member, and a drive section that supplies power to the piezoelectric element. The drive section changes the applied voltage and frequency of the AC power supplied to the piezoelectric element based on the command of feeder control device 72. The amplitude and frequency of the vibration applied to the track member 60 are thus adjusted to define the rotation direction of the elliptical motion of track member 60. When the rotation direction of the elliptical motion due to the amplitude, frequency, and vibration of the vibration of track member 60 changes, the conveyance speed, the degree of dispersion, the conveyance direction, and the like of supply component 91s to be conveyed change.

In addition, vibration device 71 can apply an external force in the conveyance direction to supply component 91s in a bulk state even if multiple components 91 included in supply component 91s are supplied to be adjacent to each other and deposited on conveyance path Rd0. In other words, vibration device 71 can simultaneously convey multiple components 91 included in supply component 91s.

Here, the operation of vibration device 71 when conveying supply component 91s on conveyance path Rd0 toward supply region As0 is referred to as a feeding operation. In addition, the operation of vibration device 71 when conveying supply component 91s on conveyance path Rd0 toward receiving region Ar0 is referred to as a return operation. The direction of the elliptical motion of track member 60 is switched by switching the feeding operation and the return operation of vibration device 71. In addition, vibration device 71 functions as an accommodation device that accommodates supply component 91s in cavity 63 of at least a part of cavity group 64.

Feeder control device 72 includes a known computing device and a storage device, and is configured with a control circuit. In a state in which bulk feeder 50 is installed in slot 12a, feeder control device 72 is supplied with power via connector M a to communicate with control device 20 of component mounter 10. Feeder control device 72 executes the feeding operation and the return operation of vibration device 71 in the component supply processing for supplying supply component 91s to supply region As0.

Specifically, feeder control device 72 transmits a command to the drive section of vibration device 71 when executing the feeding operation. As a result, the drive section supplies a predetermined electric power to the piezoelectric element so that track member 60 is vibrated via the support member. As a result, supply component 91s on conveyance path Rd0 is conveyed under an external force to move to the front side in the conveyance direction.

In addition, feeder control device 72 realizes various conveyance modes by combining the feeding operation and the return operation of vibration device 71. For example, feeder control device 72 continues the feeding operation until supply component 91s illustrated in FIG. 3 reaches the vicinity of tip portion 62 of track member 60 after at least a part of supply component 91s on conveyance path Rd0 reaches supply region As0. At this time, the return operation and the feeding operation may be repeatedly executed so that supply component 91s is retained in supply region As0 in a state in which track member 60 is vibrated.

Thereafter, feeder control device 72 executes the return operation in a state in which at least a part of supply component 91s on conveyance path Rd0 is accommodated in multiple cavities 63, thereby retracting remaining supply component 91s from supply region As0 to receiving region Ar0 side. As a result, component 91 is appropriately accommodated in a predetermined number or more of cavities 63 out of multiple (120) cavities 63 of cavity group 64. Feeder control device 72 can appropriately set the time when the feeding operation and the return operation are executed, the time when the retention is operated in the accommodation step, and the number of times that the repetitive operation is executed. In addition, feeder control device 72 may adjust the amplitude, frequency, and the like of the vibration when vibration device 71 vibrates track member 60 according to the type of component 91 accommodated in component case 52.

1-3. Configuration of Example of First Maintenance Device 30

Figure 4:
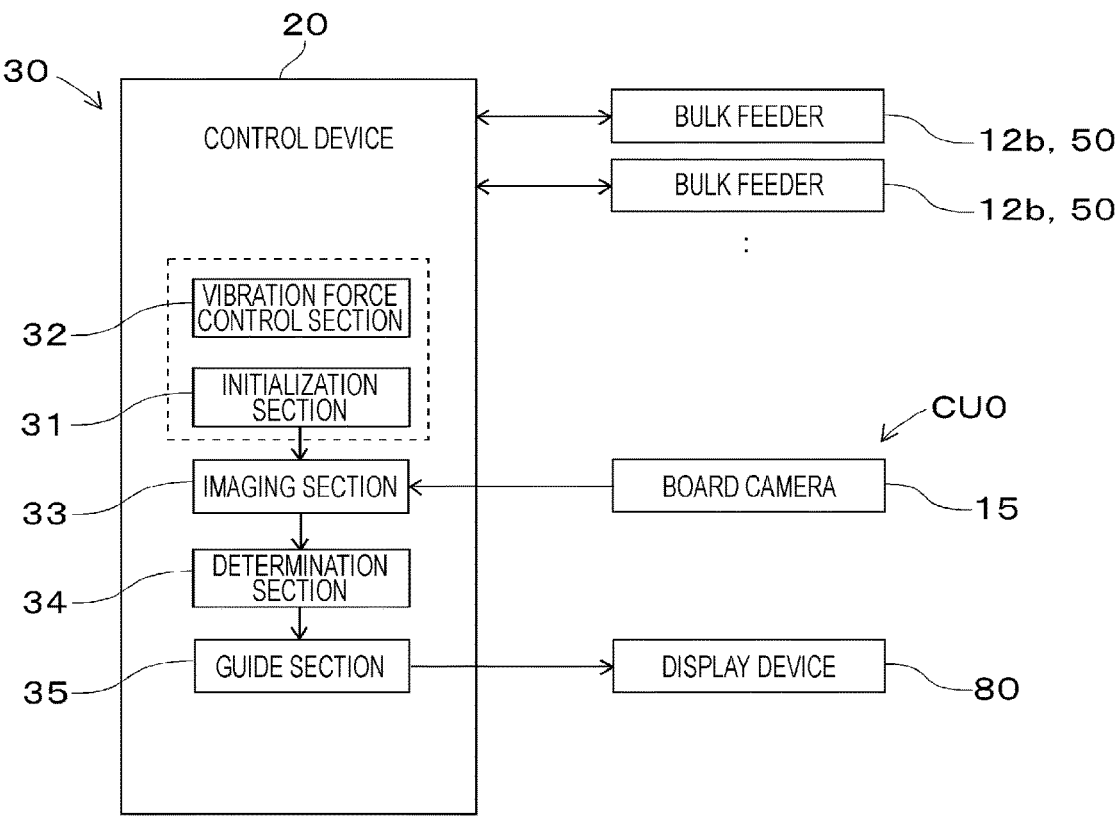
FIG. 4 is a block diagram illustrating an example of a control block of a first maintenance device.

Maintenance device 30 is applied to bulk feeder 50 including feeder main body section 51, track member 60, vibration device 71, and cavity group 64. When viewed as a control block, maintenance device 30 includes initialization section 31 and vibration force control section 32. Maintenance device 30 may also include imaging section 33 and determination section 34. Maintenance device 30 may also include guide section 35. As illustrated in FIG. 4, maintenance device 30 of the present embodiment includes initialization section 31, vibration force control section 32, imaging section 33, determination section 34, and guide section 35.

Maintenance device 30 can be provided in control device 20 of component mounter 10, for example. In addition, maintenance device 30 can be provided in a control device other than component mounter 10. In addition, maintenance device 30 may be formed on a cloud. As illustrated in FIG. 4, maintenance device 30 of the present embodiment is provided in control device 20 of component mounter 10.

Figure 5:
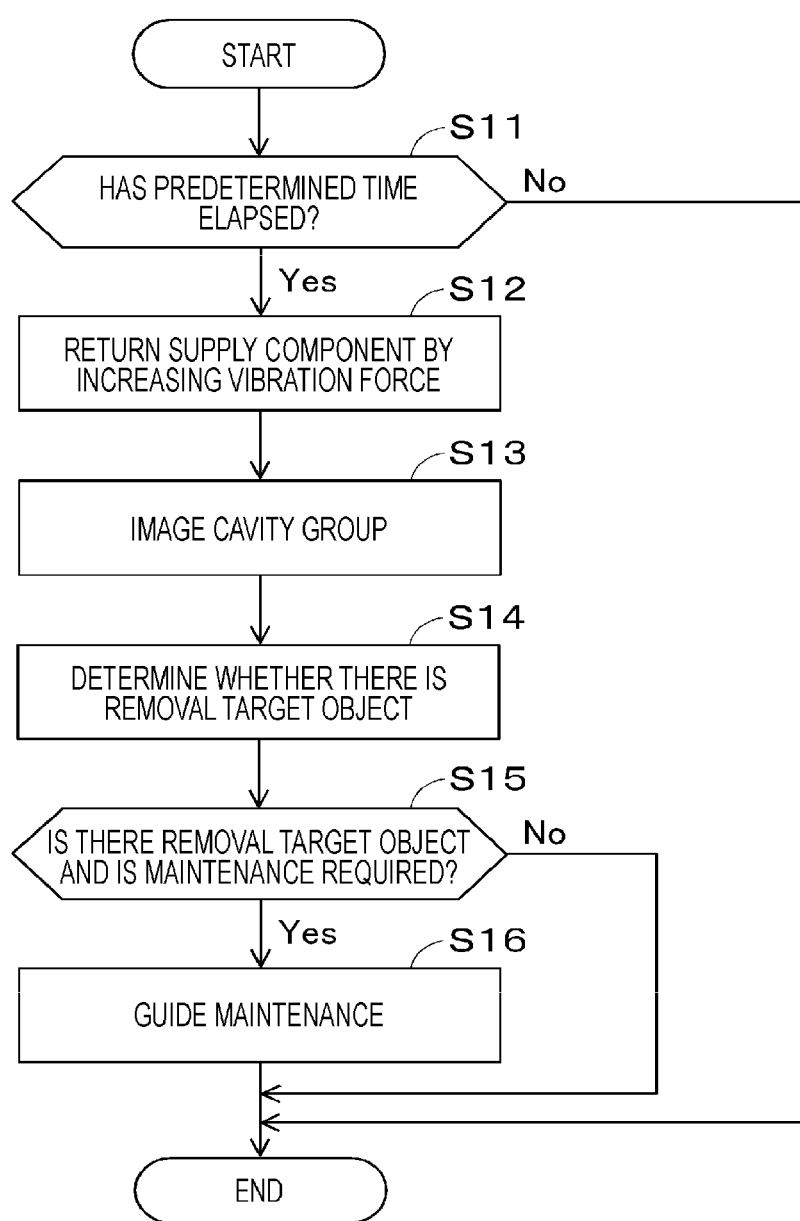
FIG. 5 is a flowchart illustrating an example of a control procedure by the first maintenance device.

In addition, maintenance device 30 executes control in accordance with the flowchart illustrated in FIG. 5. Initialization section 31 performs the determination illustrated in step S11 and the processing illustrated in step S12. Vibration force control section 32 performs the processing illustrated in step S12. Imaging section 33 performs the processing illustrated in step S13. Determination section 34 performs the processing illustrated in step S14. Guide Section 35 performs the determination in step S15 and the processing in step S16.

1-3-1. Initialization Section 31 and Vibration Force Control Section 32

Figures 6, 7:
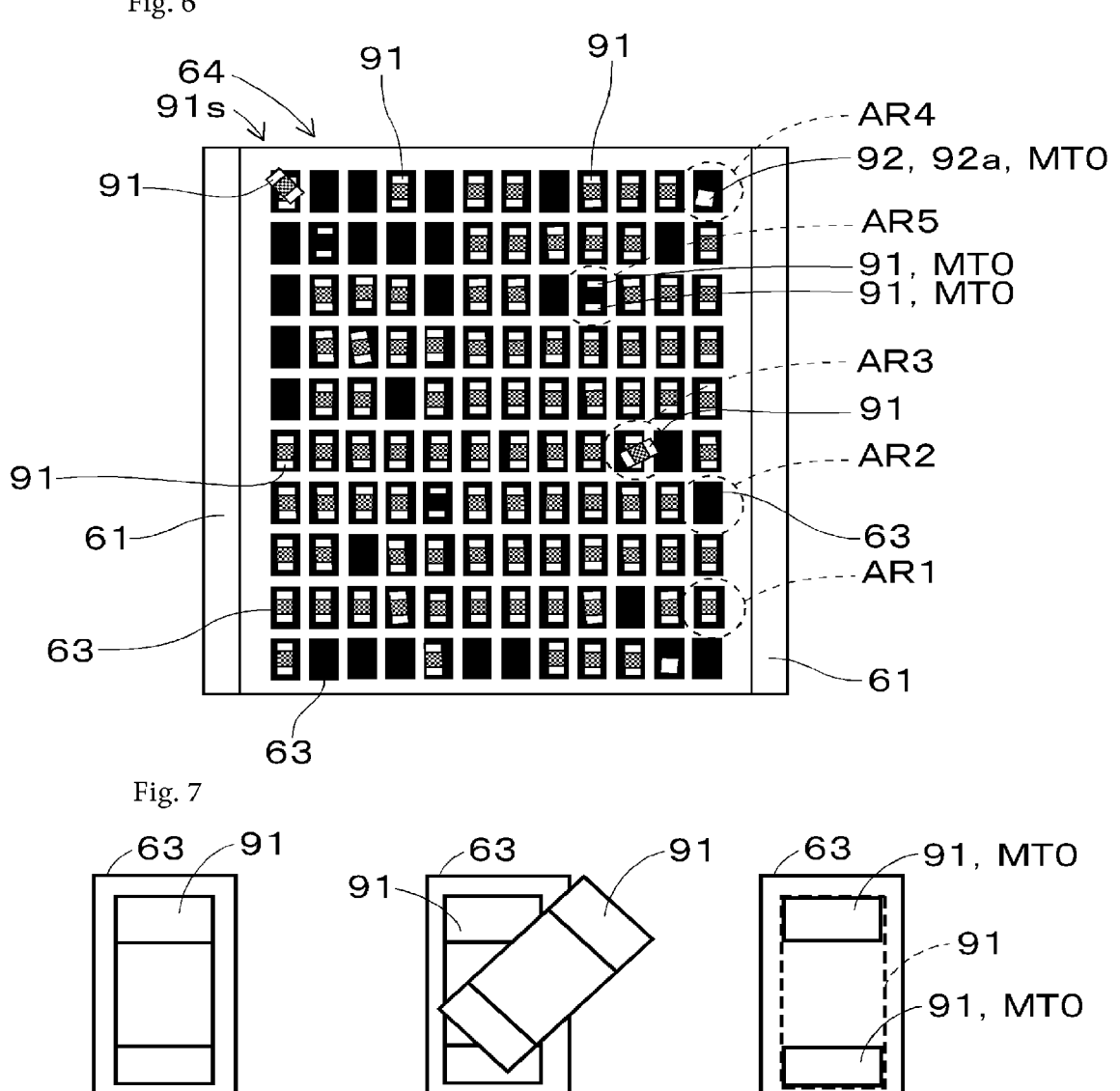
FIG. 6 is a plan view illustrating an example of a cavity group to which a supply component is supplied.
FIG. 7 is a schematic view illustrating an example of an accommodation state of the components accommodated in the three cavities of FIG. 6.

FIG. 6 illustrates an example of cavity group 64 to which supply component 91s is supplied. FIG. 6 illustrates an example of the accommodation state of component 91 in a total of 120 cavities 63, which 10 cavities in the conveyance direction, and 12 cavities in the width direction of conveyance path Rd0 are respectively arranged. FIG. 7 illustrates an example of the accommodation state of component 91 accommodated in three cavities 63 in FIG. 6.

As in the case of component 91 accommodated in cavity 63 on the left side of the drawing sheet in FIG. 7, there is component 91 appropriately accommodated in cavity 63 (region AR1 in FIG. 6 and the like). In addition, there is cavity 63 in which component 91 is not accommodated (such as region AR2 and the like). Further, as in the case of component 91 accommodated in cavity 63 in the center of the drawing sheet in FIG. 7, there is component 91 (such as region AR3) in which other components 91 are deposited (overlapped). In addition, there is cavity 63 in which foreign matter 92 other than component 91 is accommodated (region AR4 and the like). Further, as in the case of component 91 accommodated in cavity 63 on the right side of the drawing sheet in FIG. 7, multiple (two in FIG. 7) components 91 are accommodated in one cavity 63 (two components 91 are accommodated in a standing state) (region AR5 and the like).

Among regions AR2 to AR5 in which component 91 is difficult to be collected, region AR2 and region AR3 may be canceled while the supply of supply component 91s is repeated. However, region AR4 and region AR5 may not be canceled even if the supply of supply component 91s is repeated. For example, foreign matter 92 includes electrode member 92a having a portion of at least a part of the electrode of component 91 peeled off. Foreign matter 92 includes sticky dust and the like. These members may be fitted in cavity 63 and remain.

Further, when multiple components 91 are accommodated in one cavity 63, a stacked state in which supply component 91s is fitted in one cavity 63 may occur. As these situations occur, the number of cavities 63 capable of supplying supply component 91s may decrease, resulting in a decrease in the production efficiency of a board product. Therefore, initialization section 31 and vibration force control section 32 periodically maintain cavity group 64. In the present description, at least one of foreign matter 92 remaining in cavity group 64 and supply component 91s fitted in cavity 63 of cavity group 64 is referred to as removal target object MT0.

Every time the use time of bulk feeder 50 elapses a predetermined time, initialization section 31 returns supply component 91s existing in cavity group 64 toward receiving region Ar0, and sets supply component 91s to the initialization state in which supply component 91s does not exist as much as possible in cavity group 64 (when Yes in step S11 and step S12 illustrated in FIG. 5). The predetermined time is set based on a relationship between the use time of bulk feeder 50 and the state of cavity group 64 acquired in advance by simulation, verification by an actual machine, or the like. For example, the predetermined time can be set to a time until the number of cavities 63 in which removal target object MT0 exists exceeds a predetermined allowable number. In addition, the predetermined time can be set to a time until the throughput of component mounter 10 becomes equal to or less than a predetermined threshold value.

As described above, feeder control device 72 executes the feeding operation and the return operation of vibration device 71. Therefore, initialization section 31 causes feeder control device 72 to execute the return operation of vibration device 71 every time the use time of bulk feeder 50 elapses a predetermined time. From this, supply component 91s existing in cavity group 64 is returned toward receiving region Ar0.

Since there may be supply component 91s in a stacked state, it may be difficult to return all supply components 91s existing in cavity group 64. Therefore, initialization section 31 sets an initialization state in which supply component 91s does not exist in cavity group 64 as much as possible. In addition, it was found that removal target object MT0 is not removed enough by the vibration force to be applied by vibration device 71 to track member 60 during the normal return operation to be executed in order to adjust the number of supply components 91s to be conveyed to cavity group 64 when a board product is produced. Therefore, vibration force control section 32 is provided.

Vibration force control section 32 increases the vibration force to be applied by vibration device 71 to track member 60 in initialization section 31 as compared with a case where supply component 91s is returned from supply region As0 toward receiving region Ar0 in order to adjust the number of supply components 91s to be conveyed to cavity group 64 when a board product is produced (step S12).

As described above, the drive section of vibration device 71 changes the applied voltage and the frequency of the AC power supplied to the piezoelectric element based on the command of feeder control device 72. The amplitude and frequency of the vibration applied to track member 60 are thus adjusted. Therefore, vibration force control section 32 causes feeder control device 72 to send the drive section of vibration device 71 a command for increasing the applied voltage of the AC power to be supplied to the piezoelectric element as compared with the case of the return operation in manufacturing a board product to increase the amplitude of the vibration applied to track member 60. In addition, vibration force control section 32 causes feeder control device 72 to send the drive section of vibration device 71 a command for increasing the frequency of the AC power to be supplied to the piezoelectric element as compared with the case of the return operation in manufacturing a board product to increase the frequency of the vibration applied to track member 60.

Further, vibration force control section 32 can cause feeder control device 72 to send the drive section of vibration device 71 a command for increasing both the applied voltage and the frequency of the AC power to be supplied to the piezoelectric element as compared with the case of the return operation in manufacturing a board product to increase the amplitude of the vibration to be applied to track member 60 and the frequency. The increase ratio of the vibration force of vibration device 71 (the increase ratio of the amplitude or the increase ratio of the frequency of the vibration to be applied to track member 60) is acquired in advance by simulation, verification by an actual machine, or the like.

1-3-2. Imaging Section 33 and Determination Section 34

Initialization section 31 and vibration force control section 32 remove at least a part of removal target object MT0 from cavity group 64. Imaging section 33 and determination section 34 are provided to determine whether there is removal target object MT0 included in cavity group 64.

Imaging section 33 causes imaging device CU0 to image cavity group 64 that are set to the initialization state by initialization section 31 (step S13 illustrated in FIG. 5). As imaging device CU0, any known imaging device can be used as long as cavity group 64 can be imaged. As imaging device CU0, for example, board camera 15 can be used. Board camera 15 images at least a part of cavities 63 included in cavity group 64 from above. In a case where it is difficult to image all cavities 63 included in cavity group 64 at once, board camera 15 can divide cavity group 64 into multiple regions and image at least one cavity 63 for each divided region.

Figure 8:
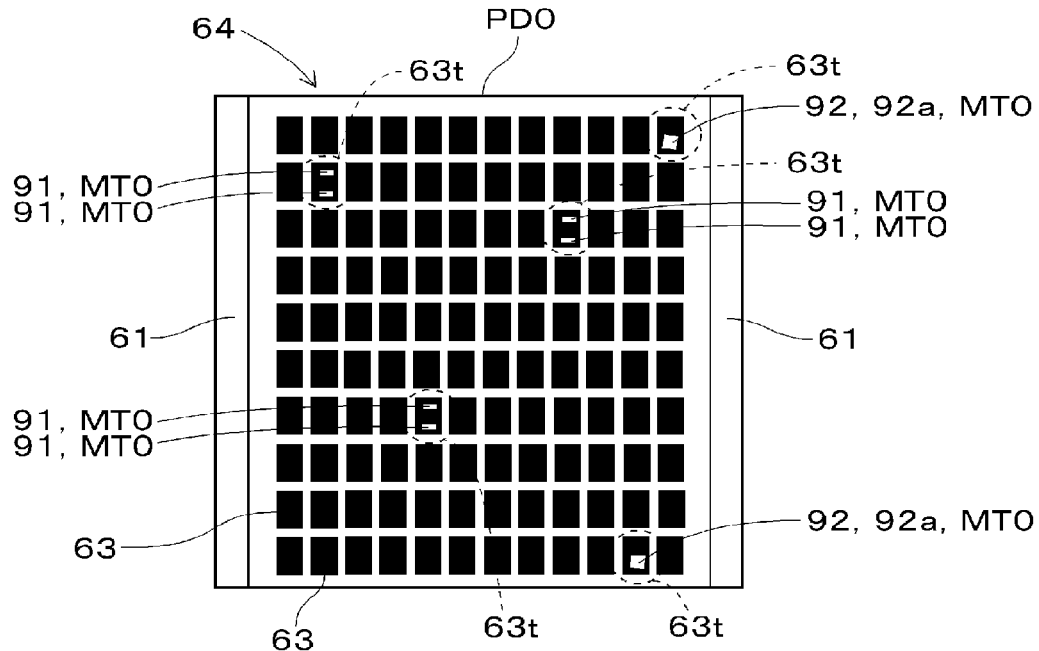
FIG. 8 is a schematic view illustrating an example of image data of the cavity group.

Imaging section 33 can cause imaging device CU0 to image cavity group 64 every time cavity group 64 is set to the initialization state by initialization section 31. In addition, imaging section 33 can also cause imaging device CU0 to image cavity group 64 every time cavity group 64 is set to the initialization state by initialization section 31 a predetermined number of times. FIG. 8 illustrates an example of image data PD0 of cavity group 64 acquired by imaging section 33. Since cavity group 64 is set to the initialization state by initialization section 31, cavity group 64 does not have component 91 that can be collected, but have removal target object MT0 only.

Determination section 34 performs image processing on image data PD0 of cavity group 64 acquired by imaging section 33 to determine whether there is removal target object MT0 (step S14 illustrated in FIG. 5). The image processing is not limited as long as removal target object MT0 is extracted from image data PD0 of cavity group 64. For example, determination section 34 may perform binarization processing on image data PD0 of cavity group 64 acquired by imaging section 33 to determine whether there is removal target object MT0.

As illustrated in FIG. 6, in the present embodiment, each of multiple (120) cavities 63 of cavity group 64 is colored in a black color. In addition, removal target object MT0 is white electrode member 92a that is foreign matter 92 and has a portion of at least a part of the electrode of component 91 peeled off. In this case, it is easy to recognize electrode member 92a by the binarization processing, and determination section 34 may perform binarization processing on image data PD0 of cavity group 64 acquired by imaging section 33 to determine whether there is electrode member 92a.

The binarization processing is not limited to the extraction of electrode member 92a, and can be used for extracting various removal target objects MT0. For example, the binarization processing can be used for extracting supply component 91s (supply component 91s in the stacked state) that is fitted in cavity 63 of cavity group 64. In addition, the binarization processing can be used for extracting sticky dust and the like. In the example illustrated in FIG. 8, electrode member 92a and supply component 91s in the stacked state are extracted, and determination section 34 determines that electrode member 92a and supply component 91s in the stacked state exist. Determination section 34 can also determine whether there is removal target object MT0 by increasing or decreasing the threshold value of the binarization processing according to the type of removal target object MT0.

1-3-3. Guide Section 35

When determination section 34 determines that there is removal target object MT0 and the maintenance of cavity group 64 is required, guide section 35 guides the maintenance of cavity group 64 (when Yes in step S15 and step S16 illustrated in FIG. 5).

The more the number of target cavities 63t that are determined to have removal target object MT0 by determination section 34, the number of cavities 63 capable of supplying supply component 91s decreases, and the production efficiency of a board product tends to decrease. Therefore, guide section 35 can determine that maintenance of cavity group 64 is required when the number of target cavities 63t determined to have removal target object MT0 by determination section 34 exceeds a predetermined allowable number.

In addition, because there is removal target object MT0, the lower the throughput of component mounter 10 (the production amount of a board product per unit time), the more the maintenance of cavity group 64 is required. Therefore, guide section 35 can also determine that the maintenance of cavity group 64 is required when the throughput of component mounter 10 is equal to or less than a predetermined threshold value.

Guide Section 35 can also determine that the maintenance of cavity group 64 is required when the number of target cavities 63t determined by determination section 34 to have removal target object MT0 exceeds a predetermined allowable number and the throughput of component mounter 10 is equal to or less than a predetermined threshold value. In addition, the allowable number of target cavities 63t and the threshold value of the throughput are acquired in advance by simulation, verification by an actual machine, or the like. For example, the allowable number of target cavities 63t can be set to secure the maximum number of components 91 collected by the collection operation in one pick-and-place cycle.

Figure 9:
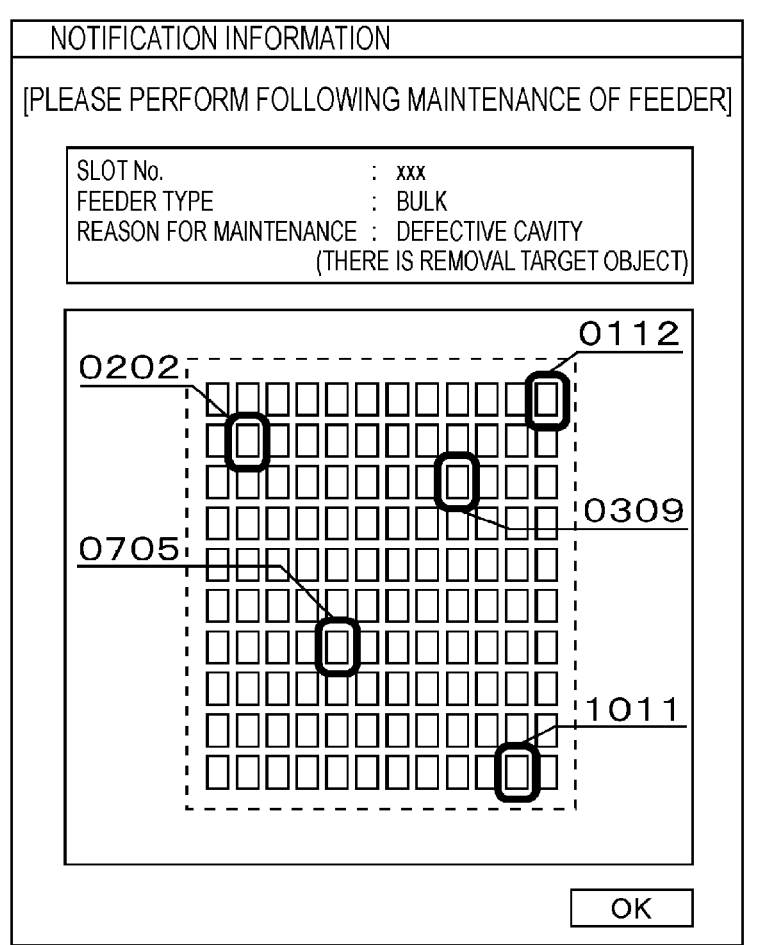
FIG. 9 is a schematic view illustrating a guide example of maintenance of the cavity group.

Guide Section 35 can guide the maintenance of cavity group 64 by using, for example, display device 80 illustrated in FIGS. 1 and 4. As display device 80, any known display device can be used as long as the maintenance of cavity group 64 can be guided. FIG. 9 illustrates a guide example of maintenance of cavity group 64 by guide section 35.

Guide Section 35 can guide the position of cavity 63 having removal target object MT0 in cavity group 64. Guide Section 35 only needs to guide the position of cavity 63, and the guiding method is not limited. The bold rectangle in FIG. 9 represents cavity 63 determined by determination section 34 to have removal target object MT0 based on image data PD0 of cavity group 64 illustrated in FIG. 8.

Further, as illustrated in FIG. 1, bulk feeder 50 of the present embodiment is installed in predetermined slot 12a among multiple slots 12a of component supply device 12 of component mounter 10. When multiple bulk feeders 50 are installed in multiple slots 12a of component supply device 12, it is difficult for the worker to recognize bulk feeder 50 requiring the maintenance of cavity group 64. Therefore, guide section 35 may guide together the slot position at which bulk feeder 50 requiring the maintenance of cavity group 64 is installed. In the guide example in FIG. 9, a slot number (xxx) indicating the slot position is guided. In the guide example in FIG. 9, an abbreviation (bulk) indicating that the feeder type is bulk feeder 50 and a cause of maintenance (a defect in the cavity (having a removal target object)) are guided together.

Cavity group 64 has a unique address assigned to each of multiple (120) cavities 63. The unique address has continuity associated with the arrangement of multiple (120) cavities 63. Specifically, the unique address may be a numerical value merely from (001) to (120). In addition, the unique address may be a combination of a numerical value from (01) to (10) indicating the number of a row and a numerical value from (01) to (12) indicating the number of a column (for example, in the case of cavity 63 in row 7 row and column 12 (0712)). Further, the unique address may be any unique information associated with multiple (120) cavities 63 in the one-by-one manner, and may include a character string or the like in addition to the numerical value.

In a case where each of multiple (120) cavities 63 is assigned a unique address, guide section 35 may also guide the address of cavity 63 having removal target object removed MT0. In the example illustrated in FIG. 9, a unique address is assigned to each of multiple (120) cavities 63 by a combination of a numerical value from (01) to (10) indicating the number of a row and a numerical value from (01) to (12) indicating the number of a column. Guide Section 35 guides an address of cavity 63 having removal target object MT0 by a combination of a numerical value indicating the number of a row and a numerical value indicating the number of a column. The address is attached to a lead line drawn from the bold rectangle described above.

When the maintenance of cavity group 64 is guided by guide section 35 (when the processing in step S16 is completed), the control is temporarily completed. In addition, even when the use time of bulk feeder 50 has not elapsed a predetermined time (when No in step S11), the control is temporarily ended.

1-4. Example of Configuration of Second Maintenance Device 40

Maintenance device 40 is applied to bulk feeder 50 including feeder main body section 51, track member 60, vibration device 71, and a cavity group 64. Maintenance device 40 includes imaging section 43 and determination section 44 when viewed as a control block. Maintenance device 40 may also include initialization section 41 and vibration force control section 42. Maintenance device 40 may also include guide section 45. Component mounter 10 may include judgement section 46.

Figure 10:
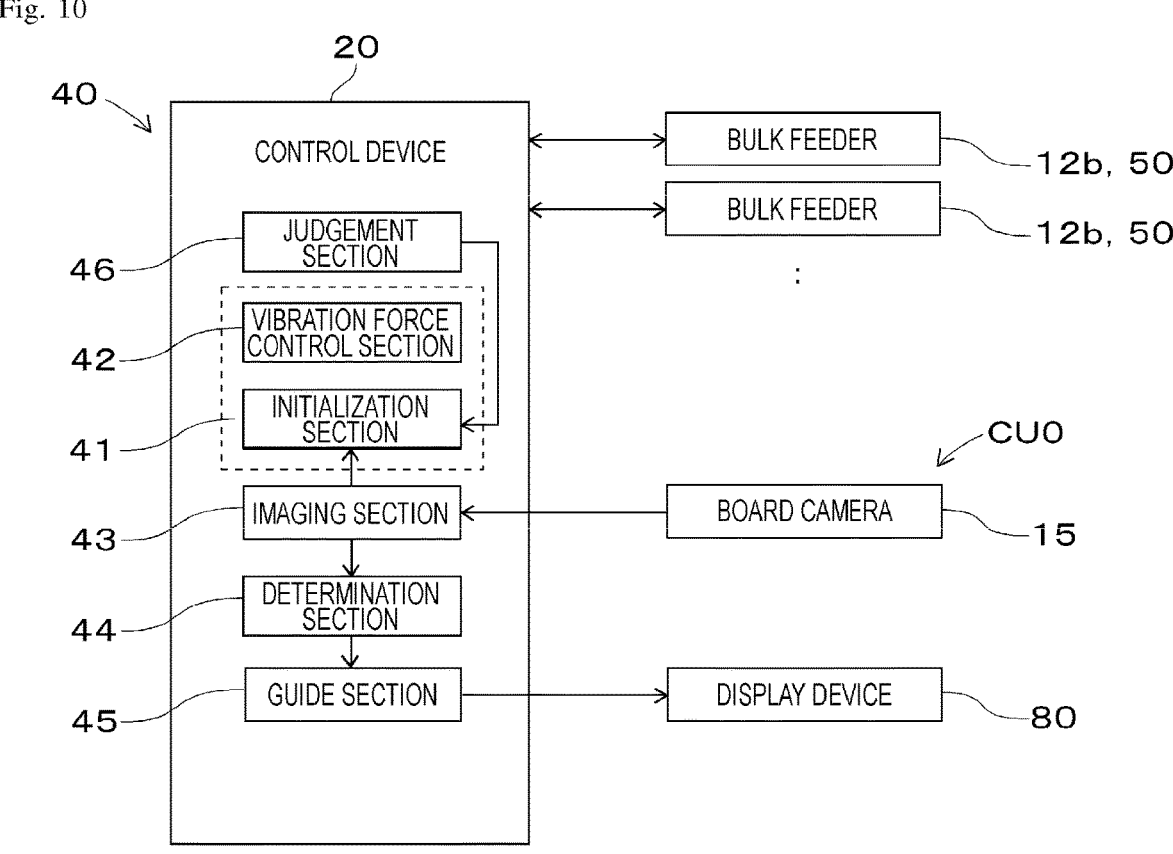
FIG. 10 is a block diagram illustrating an example of a control block of a second maintenance device.

As illustrated in FIG. 10, maintenance device 40 of the present embodiment includes imaging section 43, determination section 44, initialization section 41, vibration force control section 42, and guide section 45. Control device 20 of component mounter 10 includes judgement section 46. Imaging section 43 corresponds to imaging section 33, and determination section 44 corresponds to determination section 34. Initialization section 41 corresponds to initialization section 31, and vibration force control section 42 corresponds to vibration force control section 32. Guide Section 45 corresponds to guide section 35. Accordingly, redundant descriptions are omitted in the present description.

Figure 11:
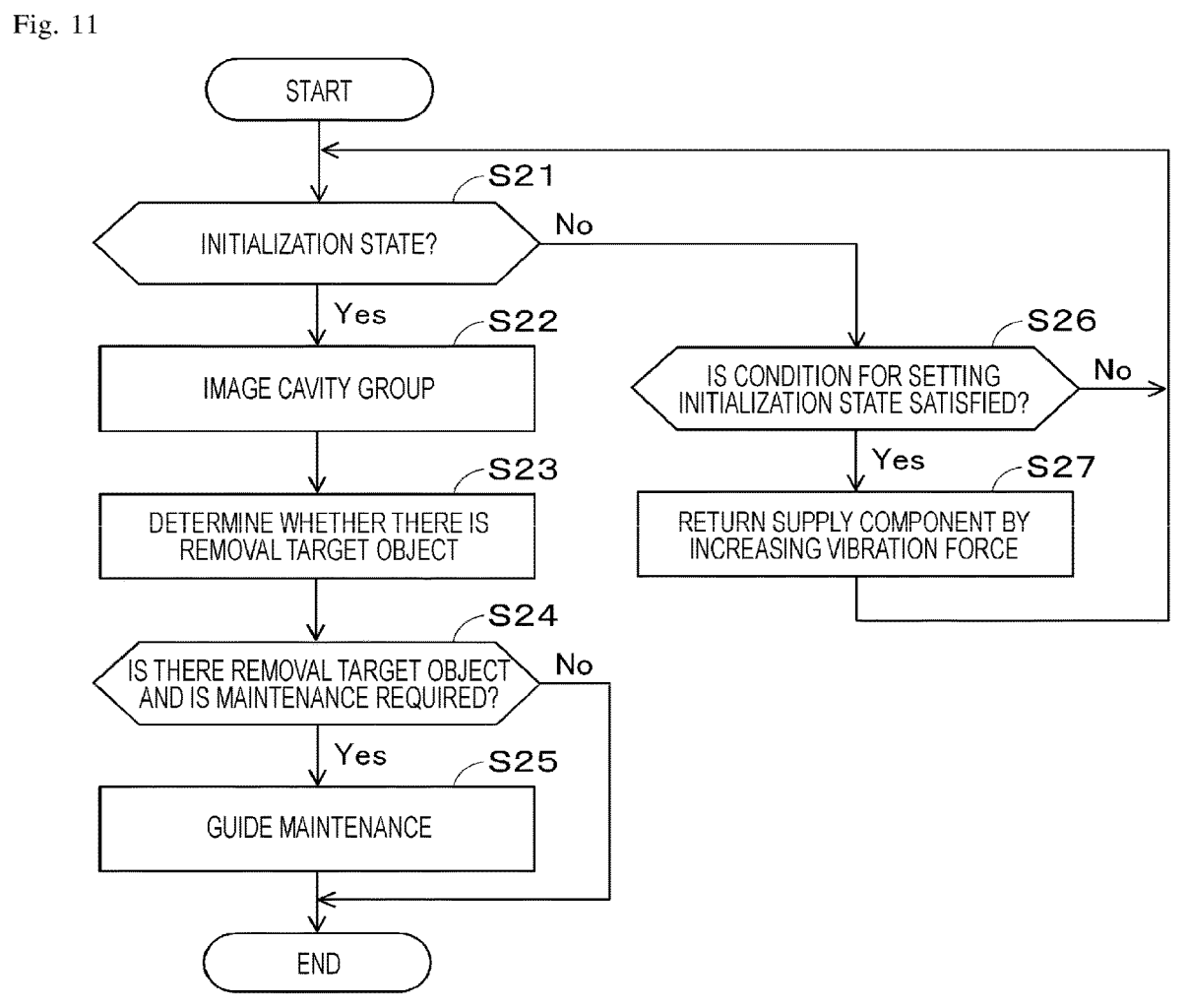

In addition, maintenance device 40 executes control in accordance with the flowchart illustrated in FIG. 11. Imaging section 43 performs the determination illustrated in step S21 and the processing illustrated in step S22. Determination section 44 performs the processing illustrated in step S23. Initialization section 41 performs the determination in step S26 and the processing in step S27. Vibration force control section 42 performs the processing illustrated in step S27. Guide Section 45 performs the determination in step S24 and the processing in step S25.

1-4-1. Imaging Section 43 and Determination Section 44

Imaging section 43 causes imaging device CU0 to image cavity group 64 in the initialization state in which supply component 91s does not exist as much as possible in cavity group 64 (when Yes in step S21 illustrated in FIG. 11 and step S22). Imaging section 43 can cause imaging device CU0 to image cavity group 64 in the initialization state in the same manner as imaging section 33. However, cavity group 64 is not limited to a case when set to the initialization state by initialization section 41. For example, cavity group 64 can be set to the initialization state by a suction section that picks up supply component 91s existing in cavity group 64.

Determination section 44 performs image processing on image data PD0 of cavity group 64 acquired by imaging section 43, and determines whether there is removal target object MT0 that is at least one of foreign matter 92 remaining in cavity group 64 and supply component 91s fitted in cavity 63 of cavity group 64 (step S23). Determination section 44 can determine whether there is removal target object MT0 in the same manner as determination section 34.

1-4-2. Initialization Section 41, Vibration Force Control Section 42, and Judgement Section 46

When cavity group 64 is not in the initialization state (when No in step S21) and a predetermined condition is satisfied, initialization section 41 returns supply component 91s existing in cavity group 64 toward receiving region Ar0, and sets cavity group 64 to the initialization state (steps S26 and S27). Initialization section 31 differs from initialization section 41 in that cavity group 64 is set to the initialization state every time the use time of bulk feeder 50 elapses a predetermined time.

Vibration force control section 42 increases the vibration force applied by vibration device 71 to track member 60 in initialization section 41 as compared with a case where supply component 91s is returned from supply region As0 toward receiving region Ar0 in order to adjust the number of supply components 91s to be conveyed to cavity group 64 when a board product is produced (step S27). Then, the control returns to the determination illustrated in step S21. Vibration force control section 42 can increase the vibration force applied by vibration device 71 to track member 60 in the same manner as vibration force control section 32.

Judgement section 46 judges whether supply component 91s can be collected by component mounter 10 for each of multiple (120) cavities 63 of cavity group 64 before component mounter 10 starts collecting supply component 91s of cavity group 64 in manufacturing a board product. For example, judgement section 46 can cause imaging device CU0 to image cavity group 64 and perform image processing on the image data of cavity group 64 to judge whether supply component 91s can be collected.

In the example illustrated in FIG. 6 described above, judgement section 46 judges that supply component 91s can be collected for cavity 63 of region AR1. Judgement section 46 judges that supply component 91s cannot be collected for cavities 63 of regions AR2 to AR4. In cavity 63 of region AR5, multiple (two) components 91 are accommodated in one cavity 63, and it cannot be said that supply component 91s is properly accommodated in cavity 63. However, the arrangement of multiple (two) components 91 generally coincides with the arrangement of a feature portion of one component 91 (for example, the region of an electrode). Therefore, judgement section 46 may erroneously judge that supply component 91s can be collected for cavity 63 of region AR5. The judgement result for each cavity 63 by judgement section 46 is stored in, for example, a storage device of control device 20. Initialization section 41 can read the judgement result of judgement section 46 from the storage device.

When judgement section 46 judges continuously by a predetermined number of times that supply component 91s cannot be collected by component mounter 10 for same cavity 63, cavity 63 is referred to as a non-collectable cavity. In the example illustrated in FIG. 6, cavity 63 of region AR4 is assumed. The larger the number of non-collectable cavities, the number of cavities 63 capable of supplying supply component 91s decreases, and the production efficiency of a board product tends to decrease. Therefore, it is preferable that initialization section 41 may set cavity group 64 to the initialization state when the number of non-collectable cavities exceeds a predetermined allowable number (when Yes in step S26 illustrated in FIG. 11).

In addition, when judgement section 46 judges that supply component 91s can be collected by component mounter 10 for same cavity 63 and component mounter 10 attempts to collect supply component 91s, but supply component 91s cannot be collected continuously a predetermined number of times, cavity 63 is referred to as a collection fail cavity. In the example illustrated in FIG. 6, cavity 63 of region AR5 is assumed. The larger the number of collection fail cavities, the lower the throughput of component mounter 10, and the production efficiency of a board product tends to decrease. Therefore, it is preferable that initialization section 41 sets cavity group 64 to the initialization state when the number of collection fail cavities exceeds a predetermined allowable number (when Yes in step S26).

Initialization section 41 can also set cavity group 64 to the initialization state when the number of non-collectable cavities exceeds a predetermined allowable number and the number of collection fail cavities exceeds a predetermined allowable number. In addition, when the number of non-collectable cavities is equal to or less than the predetermined allowable number (when No in step S26), the control returns to the determination illustrated in step S21. The same applies to a case where the number of collection fail cavities is equal to or less than the predetermined allowable number. Further, the predetermined number of times, the allowable number of non-collectable cavities, and the allowable number of collection fail cavities are acquired in advance by simulation, verification by an actual machine, or the like.

1-4-3. Guide Section 45

When determination section 44 determines that there is removal target object MT0 and the maintenance of cavity group 64 is required, guide section 45 guides the maintenance of cavity group 64 (steps S24 and S25). The control is temporarily ended. Guide Section 45 can guide the maintenance of cavity group 64 in the same manner as guide section 35.

2. Maintenance Method

What has been described above for first maintenance device 30 can be similarly applied to a first maintenance method. Specifically, the first maintenance method includes an initialization step and a vibration force control step. The initialization step corresponds to control performed by initialization section 31. The vibration force control step corresponds to control performed by vibration force control section 32. The first maintenance method can also include an imaging step and a determination step. The imaging step corresponds to control performed by imaging section 33. The determination step corresponds to control performed by determination section 34. The first maintenance method can also include a guiding step. The guiding step corresponds to control performed by guide section 35.

The same applies to a second maintenance method as described above with respect to second maintenance device 40. Specifically, the second maintenance method includes an imaging step and a determination step. The imaging step corresponds to control performed by imaging section 43. The determination step corresponds to control performed by determination section 44. The second maintenance method may include an initialization step and a vibration force control step. The initialization step corresponds to control performed by initialization section 41. The vibration force control step corresponds to control performed by vibration force control section 42. The second maintenance method may also include a guiding step. The guiding step corresponds to control performed by guide section 45. The mounting processing by component mounter 10 may include a judgement step. The judgement step corresponds to control performed by judgement section 46.

3. Example of Advantageous Effects of Embodiment

According to first maintenance device 30, cavity group 64 can be periodically maintained. In addition, according to second maintenance device 40, it is possible to determine whether there is removal target object MT0 in cavity group 64.

REFERENCE SIGNS LIST

10: component mounter, 12: component supply device, 12*a*: slot, 30, 40: maintenance device, 31, 41: initialization section, 32, 42: vibration force control section, 33, 43: imaging section, 34, 44: determination section, 35, 45: guide section, 46: judgement section, 50: bulk feeder, 51: feeder main body section, 52: component case, 60: track member, 63: cavity, 63*t*: target cavity, 64: cavity group, 71: vibration device, 91: component, 91*s*: supply component, 92: foreign matter, 92*a*: electrode member, Ar0: receiving region, As0: supply region, Rd0: conveyance path, MT0: removal target object, CU0: imaging device, PD0: image data

The invention claimed is:

1. A maintenance device applied to a bulk feeder including a feeder main body section, a track member that includes a receiving region that is provided in the feeder main body section and receives a supply component which is a part of multiple supply components discharged from a component case in which the supply components are accommodated in a bulk state and supplied to a component mounter, a supply region where the component mounter can collect the supply component, and a conveyance path on which the supply component is conveyed between the receiving region and the supply region, a vibration device that is provided in the feeder main body section and vibrates the track member to convey the supply component on the conveyance path between the receiving region and the supply region, and a cavity group that is provided in the supply region and includes multiple cavities in which one component of the supply components conveyed from the receiving region to the supply region is to be accommodated, the maintenance device comprising:

an initialization section configured to return the supply component existing in the cavity group toward the receiving region, and set the cavity group to an initialization state in which the supply component does not exist in the cavity group as much as possible every time use time of the bulk feeder elapses a predetermined time; and a vibration force control section configured to increase a vibration force to be applied to the track member by the vibration device in the initialization section compared with a case of returning the supply component from the supply region toward the receiving region in order to adjust a number of the supply components to be conveyed to the cavity group when a board product is produced.

2. The maintenance device according to claim 1, further comprising:

an imaging section configured to cause an imaging device to image the cavity group set to the initialization state by the initialization section; and a determination section configured to perform image processing on image data of the cavity group acquired by the imaging section to determine whether there is a removal target object that is at least one of a foreign matter remaining in the cavity group and the supply component fitted in a cavity of the cavity group.

3. The maintenance device according to claim 1, wherein the component mounter includes a judgement section that judges whether the supply component can be collected by the component mounter for each of the multiple cavities of the cavity group before the component mounter starts collecting the supply component of the cavity group when a board product is produced, and the initialization section sets the cavity group to the initialization state when a number of non-collectable cavities, for which the judgement section judges that the supply component cannot be collected by the component mounter continuously by a predetermined number of times for a same cavity, exceeds a predetermined allowable number.

4. The maintenance device according to claim 1, wherein the component mounter includes a judgement section that judges whether the supply component can be collected by the component mounter for each of the multiple cavities of the cavity group before the component mounter starts collecting the supply component of the cavity group when a board product is produced, and the initialization section sets the cavity group to the initialization state when a number of collection fail cavities, for which the judgement section judges that the supply component can be collected by the component mounter for a same cavity and the component mounter attempts to collect the supply component but cannot collect the supply component continuously by a predetermined number of times, exceeds a predetermined allowable number.

5. The maintenance device according to claim 2, further comprising:

a guide section configured to guide maintenance of the cavity group when the determination section determines that there is the removal target object and maintenance of the cavity group is required.

6. The maintenance device according to claim 5, wherein the guide section determines that maintenance of the cavity group is required when the number of target cavities determined by the determination section to have the removal target object exceeds a predetermined allowable number.

7. The maintenance device according to claim 5, wherein the guide section determines that maintenance of the cavity group is required when a throughput of the component mounter is equal to or less than a predetermined threshold value.

8. The maintenance device according to claim 5, wherein the guide section guides a position of the cavity having the removal target object in the cavity group.

9. The maintenance device according to claim 8, wherein
the bulk feeder is installed in a predetermined slot among
   multiple slots of a component supply device of the
   component mounter, and
the guide section indicates a slot position at which the
   bulk feeder requiring maintenance of the cavity group
   is installed.

10. The maintenance device according to claim 8, wherein
an address is assigned to each of the multiple cavities of
   the cavity group, and
the guide section indicates the address of the cavity
   having the removal target object.

11. The maintenance device according to claim 2, wherein
the removal target object is a white electrode member
   which is the foreign matter and has a portion of at least
   a part of an electrode of the component peeled off,
each of the multiple cavities of the cavity group is colored
   in a black color, and
the determination section performs binarization process-
   ing on the image data of the cavity group acquired by
   the imaging section to determine whether there is the
   removal target object.

*  *  *  *  *